United States Patent [19]
Kadota et al.

[11] Patent Number: 5,459,328
[45] Date of Patent: Oct. 17, 1995

[54] DRIVER CIRCUIT FOR LIGHT EMITTING ELEMENTS CONNECTED IN SERIES AND AN OPTICAL AMPLIFYING REPEATER USING THE SAME

[75] Inventors: Daisuke Kadota, Yukuhashi; Futoshi Ogawa, Oyama; Shinichirou Harasawa, Kawasaki, all of Japan

[73] Assignee: Fujitsu Limited, Kanagawa, Japan

[21] Appl. No.: 226,705

[22] Filed: Apr. 12, 1994

[30] Foreign Application Priority Data

May 31, 1993 [JP] Japan ................................. 5-149827

[51] Int. Cl.⁶ ........................................................ G02F 1/00
[52] U.S. Cl. ........................ 250/551; 250/214 A; 359/174
[58] Field of Search ............................ 250/205, 214 A, 250/551; 315/149, 150, 151, 158; 359/176, 179, 187, 174

[56] References Cited

U.S. PATENT DOCUMENTS 4,886,334  12/1989  Aoki ......................................... 359/174
5,274,496  12/1993  Fujiwara et al. ........................ 359/177
5,383,046  1/1995  Tomofuji et al. ....................... 359/176

FOREIGN PATENT DOCUMENTS 2245757  1/1992  United Kingdom .

Primary Examiner—Stephone B. Allen

[57] ABSTRACT

A driver circuit keeps optical power from other normal light emitting elements, even if either of multiple light emitting elements has disconnection fault. The driver circuit has series connected multiple light emitting elements, which are connected to a constant current power source and a multiple light emitting power control circuits for controlling light emitting power of the corresponding light emitting elements. Each of the light emitting power control circuits has a bypass current control element connected to the corresponding light emitting element in parallel, the light receipt element for detecting light emitting power of light emitting element connected to the bypass current control element, a current control circuit for controlling current flowing through the bypass current control element in accordance with the light receipt level and the voltage detecting circuit for making larger the current flowing to the bypass current control element, when a value between terminals of the corresponding light emitting element is detected, and it becomes the fixed voltage value or above.

8 Claims, 7 Drawing Sheets

DRIVER CIRCUIT FOR LIGHT EMITTING ELEMENTS CONNECTED IN SERIES AND AN OPTICAL AMPLIFYING REPEATER USING THE SAME

BACKGROUND OF THE INVENTION

1. Field of the Invention

The present invention relates to a driver circuit for light emitting elements connected in series and an optical amplifying repeater using this circuit. More particularly, it relates to a driver circuit used in a light emitting source, which outputs composite optical power of lights emitted from plural light emitting elements.

2. Related Prior Art

FIG. 6 is a diagram for explaining a conventional circuit. In the diagram, to be concrete, a series circuit of multiple light emitting elements, which are, laser diodes $LD_1$, $LD_2$, ... $LD_n$ and a constant current power source 3 in series is connected to a power source $V_{cc}$.

$PD_1$, $PD_2$, ... $PD_n$ are light receipt elements, each of which detects optical power emitted from the corresponding light emitting element and, to be concrete, they are photo diodes.

These photo diodes are connected in series to resisters $R_1$, $R_2$, ... $R_n$, respectively and further connected to the power source $V_{cc}$.

Reference numerals "11, 12 ... 1n" are optical power control circuits (ARC), each having a first input terminal, which is supplied with the optical power level detected by the light receipt element corresponding respectively and a second input terminal which is supplied with a reference potential REF.

$T_1$, $T_2$, ... $T_n$ are bypass current control elements connected in parallel to light emitting elements $LD_1$, $LD_2$, ... $LD_n$, respectively, to be concrete, which are transistors.

The outputs from the optical power control circuits 11, 12, ... 1n as the above-described, are inputted to the bases of the bypass current control elements $T_1$, $T_2$, ... $T_n$, respectively.

Each of the optical power control circuits 11, 12, ... 1n outputs the control signal having a voltage value, which corresponds to that obtained by subtracting the light receipt level detected by the light receipt elements $PD_1$, $PD_2$, ... $PD_n$ corresponding from the reference voltage REF.

That is, when the light receipt level becomes larger, each of the optical power control circuits 11, 12 ... 1n reduces the control signal input supplied to the base of the bypass current control elements $T_1$, $T_2$, ... $T_n$. A negative feed back is given to the optical power of the light emitting elements.

When the respective optical powers from the light emitting elements $LD_1$, $LD_2$ ... $LD_n$ become larger, the respective outputs of the optical power control circuits 11, 12 ... 1n control to increase the electric currents $I_1$, $I_2$, ... $I_n$ flowing to the bypass electric current elements $T_1$, $T_2$, ... $T_n$, respectively and to decrease the electric currents $ILD_1$, $ILD_2$ ... $ILD_n$ flowing to the light emitting elements $LD_1$. $LD_2$ ... $LD_n$, respectively and the optical power therefrom.

Contrarily, when the respective optical power from the light emitting elements $LD_1$. $LD_2$ ... $LD_n$ become smaller, the respective outputs of the optical power control circuits 11, 12, ... 1n control to decrease the currents flowing through the bypass electric current elements $T_1$, $T_2$, ... $T_n$, respectively, and to increase the currents flowing through the light emitting elements $LD_1$, $LD_2$ ... $LD_n$ respectively and the optical powers therefrom.

By such the structure, the optical powers from the light emitting elements $LD_1$. $LD_2$ ... $LD_n$ are controlled so as to be constant.

In the above-described structure, for example, in the case where the light emitting element $LD_2$ becomes inferior, some problems cause as follows.

FIG. 7 illustrates a diagram for explaining these problems.

In FIG. 7, let us now consider the case where the optical power of the light emitting element $LD_2$ becomes to zero because of disconnection fault.

As the above-described, when the optical power from the light emitting element becomes smaller, each of the optical power control circuits 11, 12 ... 1n performs the control so as to make the base input of the corresponding bypass current control elements $T_1$, $T_2$, ... $T_n$ smaller and make the electric current flowing through the light emitting elements $LD_1$. $LD_2$ ... $LD_n$ larger.

Accordingly, the output from the corresponding optical power control circuit 12 controls so as to make the electric current flowing through the bypass current control element $T_2$ to zero and to make the electric current flowing only through the light emitting element $LD_2$, when the optical power of the light emitting element $LD_2$ becomes zero because of disconnection fault.

However, as the above-described, no electric current through the light emitting element $LD_2$ flows because of the light emitting element $LD_2$ being disconnected. At the same time, the electric current does not flow on the series circuit of other light emitting elements $LD_1$. $LD_2$ ... $LD_n$ and the constant current power source 3, as the electric current flowing through the bypass current control element $T_2$ is also controlled so as to be zero by the output of the optical power control circuit 12.

As the above-described, in the conventional circuit, when either of light emitting elements $LD_1$. $LD_2$ ... $LD_n$ meets with disconnection fault, the current of the corresponding bypass current control elements $T_1$, $T_2$, ... $T_n$ are also controlled so as to be zero with the control of the optical power control circuit 11, 12, ... 1n. When either one of the light emitting elements $LD_1$. $LD_2$ ... $LD_n$ can not output any optical power with disconnection as this result, such problem as no optical power from other normal light emitting elements is also able to occur.

SUMMARY OF THE INVENTION

Accordingly, it is an object of the present invention to provide a driving circuit for the light emitting element to solve the problem on the conventional circuit.

It is a further object of the present invention to provide an optical amplifying repeater using the driving circuit for the light emitting element to solve the problem on the conventional circuit.

The driver circuit according to the present invention comprises:

a series circuit of a constant current power source and multiple light emitting elements, which are connected in series; and multiple optical power control circuits for controlling the optical power corresponding to each of the multiple light emitting elements, each of said multiple optical power control circuits having, a bypass current control element, which is connected in parallel to the corresponding light emitting element of said multiple light emitting element, a light receipt element for detecting the optical power of the corresponding light emitting element connected to the bypass current control element, a current control circuit (APC) for controlling the current flowing to the bypass current control element in accordance to the light receipt level of the light emitting element and a voltage detecting circuit for controlling the current control circuit thereby to make the current flowing to said bypass current control element be larger, when the voltage value between both terminals of the corresponding light emitting element is detected and the detected voltage value becomes over the fixed voltage value.

DESCRIPTION OF THE PREFERRED EMBODIMENTS

Figure 1:
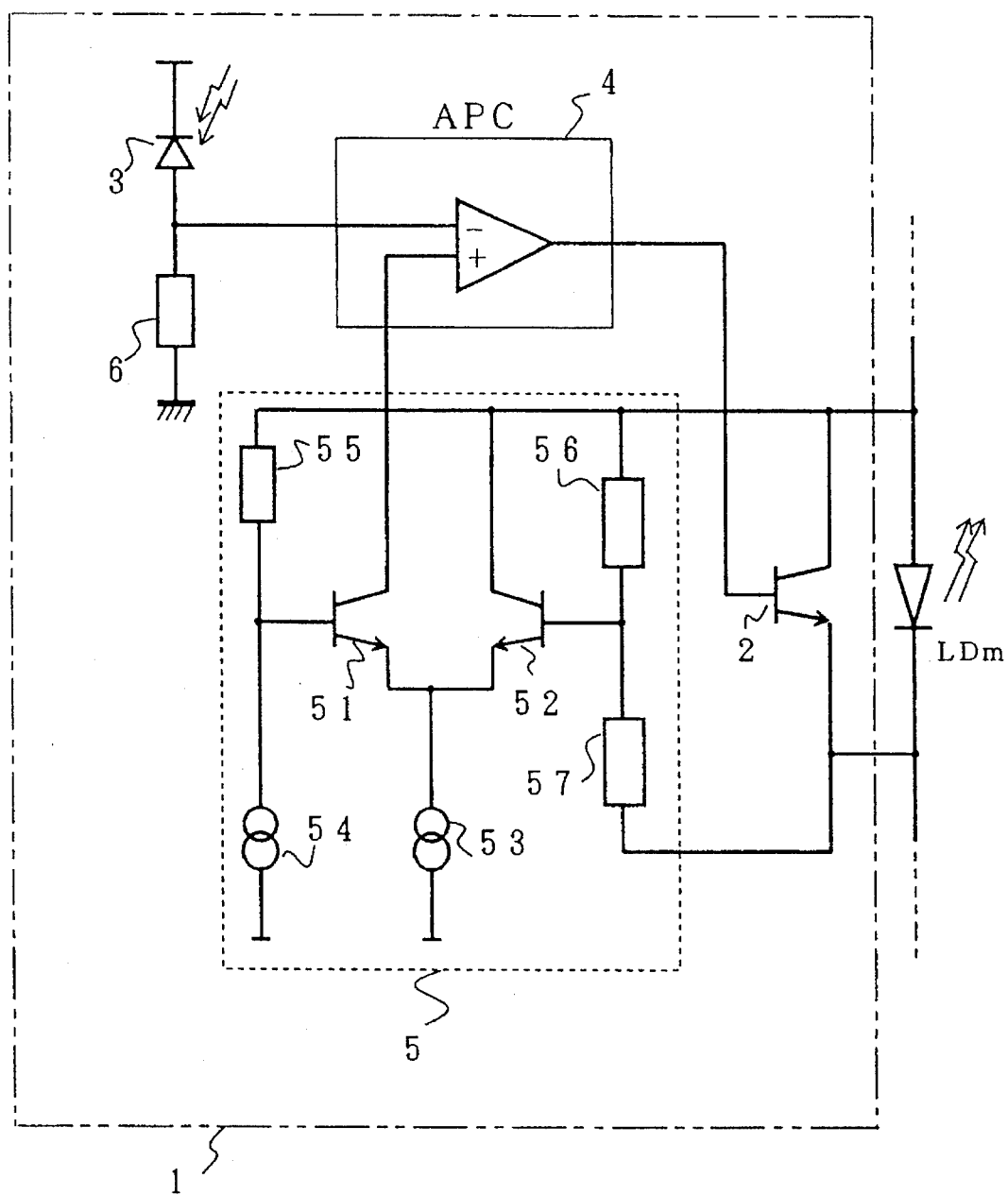
FIG. 1 is a circuit showing a first embodiment of the present invention.

FIG. 1 is a first embodiment according to the present invention. In the following explanation, same or like reference numerals are given to the components which are identical or similar.

In FIG. 1, $LD_m$ shows the mth light emitting element represented from multiple light emitting elements $LD_1, LD_2, \ldots LD_n$.

Although the reference numeral 1 is the optical power control circuit for controlling this light emitting element $LD_m$, this optical power control circuit 1 is provided in correspondence to each of multiple light emitting elements having the same structure.

The numeral 2 is a bypass current control element, to be concrete, it is an transistor having the collector and emitter connected to the light emitting element $LD_m$ in parallel. "3" is a light receipt element, for example photo diode for detecting the optical power emitted from the light emitting element $LD_m$.

"6" means a load resistance element connected to the light receipt element 3. Accordingly, when the light receipt element 3 receives the optical power from the light emitting element $LD_m$, the electric current corresponding to the light receipt level flows and a voltage potential is presented at the connecting point of the load resistance element 6 and the light receipt element 3.

"4" is a current control circuit (APC) 4 for controlling the current flowing through the bypass current control element 2 corresponding the light receipt level of the light receipt element 3 in the conventional circuit.

This current control circuit 4 has two input terminals. The voltage potential of the connecting point between the light receipt element 3 and the load resistance element 6 are connected to the first input terminal (−). On the other hand, the output from the voltage detecting circuit 5 provided according to the present invention is connected on the second input terminal (+).

In this voltage detecting circuit 5, the reference numerals 51 and 52 are a pair of the transistors having the emitters commonly connected to the constant current power source 53 and performing the differential operation. The collector of the first transistor 51 of this pair of the transistors 51 and 52 is connected to the second input terminal (+) of said current control circuit 4 as the output of the voltage detecting circuit 5.

The connecting point of series circuit of the register 55 and the constant current power source 54 is connected to the base of the first transistor 51. On the other hand, the connecting point of resisters 56 and 57 is connected to the base of the second transistor 52.

These resisters 56 and 57 are connected in series, and the both ends of the series resisters are supplied with the voltage potential between the collector and emitter of the bypass current control element 2, that is, the voltage potential of the both ends of the light emitting element $LD_m$.

The operation of a circuit of the first embodiment according to the present invention which has the above-described structure is described as follows.

The light receipt element 3 detects the optical power emitted from the light emitting element $LD_m$, and the voltage potential corresponding to the detection level is inputted to the first input terminal of the current control circuit 4. Further, the collector output of the first transistor 51 in the voltage detecting circuit 5 is inputted to the second input terminal of the current control circuit 4.

In normal operation, the electric current flowing through the light emitting element $LD_m$ is constant. Accordingly, the voltage potential between the both terminals of the element is also constant, so that the voltage potential at the connecting point of the resistances 56 and 57, that is, the base voltage potential of the second transistor 52 is constant, too.

Then, the values of resisters 55, 56 and 57 are set so that the electric current of the collector of the transistor 52 is equal to that of the constant current power source 53, and the electric current of the collector of the second transistor 51, which forms a differential pair, becomes zero.

Accordingly, the current control circuit (APC) 4 outputs the output current which is in proportion to the electric current corresponding to the light level received by the light receipt element 3 based on the constant vias current, which is decided by a reference output for setting a constant current value from a reference circuit, not shown in FIG. 1.

This output current is inputted to the base of the bypass current control element 2 and controls the electric current of the collector. Accordingly, the electric current which flows to the light emitting element $LD_m$ becomes constant, thus making the optical power constant.

On the other hand, let us consider in the case where the light emitting element causes a disconnection fault and the like, so that the optical power from the element becomes zero.

In the case where the light emitting element $LD_m$ causes disconnection fault, so that electric current can not flow, and voltage potential between the terminals of the element are ascended. Then, the voltage potential between the resisters 56 and 57 of the voltage detecting circuit 5 is ascended, thus causing voltage potential of the connecting point of the resisters 56 and 57, that is the base voltage potential of the second transistor 52 of a pair of the transistors to be lower.

Accordingly, the electric current flowing through the transistor 52 is reduced. In contrast, the first transistor 51 is switched from the state of OFF to the state of ON, and the desired collector current Ic flows. This collector current Ic is brought to the second input terminal of the current control circuit 4.

Further, the base current of the bypass current control element 2 is made larger by the output of the current control circuit 4 corresponding to this collector current Ic.

As it apparent from the above-described structure, the optical power from other light emitting elements can continue to obtain, because current supply to the other light emitting elements is performed by using the bypass current control element 2, even if it is a case where one emitting element, for example, $LD_m$ causes disconnection fault.

Figure 2:
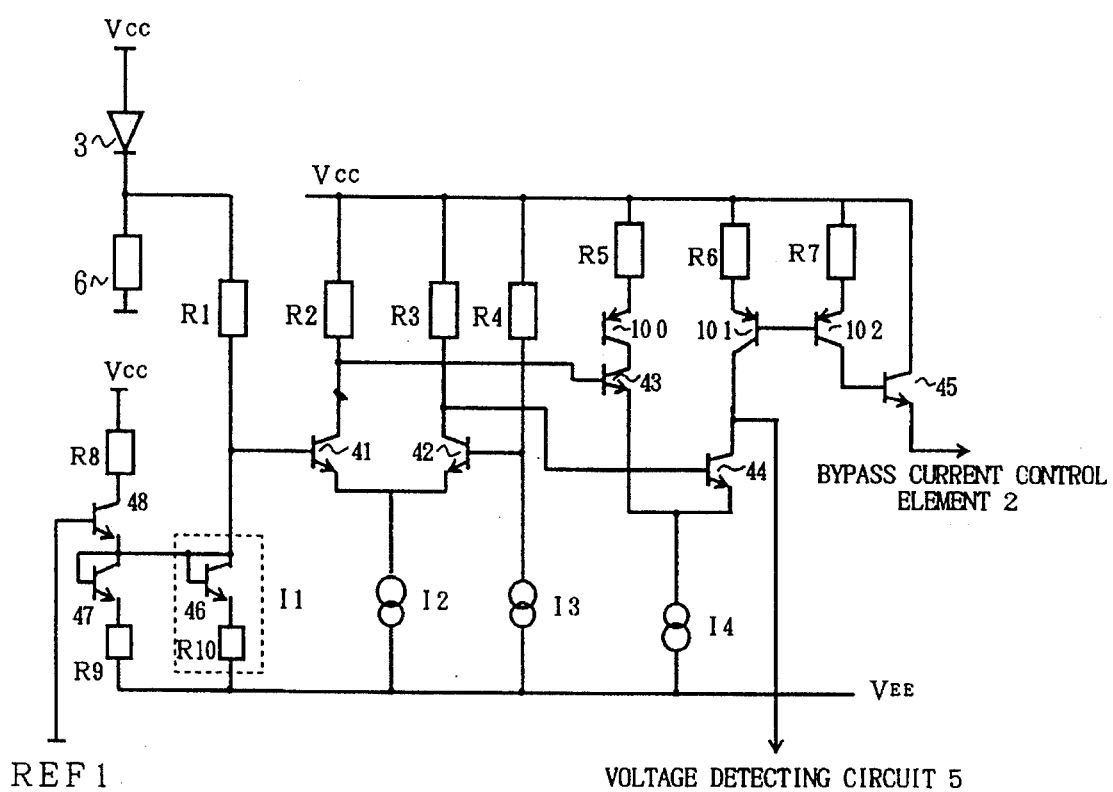
FIG. 2 is a diagram showing one example of current control circuit (APC circuit) in FIG. 1.

FIG. 2 is one example of the current control circuit (APC) 4.

Reference numerals "41" and "42" are a pair of the transistors for performing the differential operation and the constant current power source I2 is connected to the commonly connected emitters. Further, the constant current power sources I1 and I3 are connected to each of the bases.

The base of the transistor 41 becomes a first input (−) of the current control circuit 4. Accordingly, as described in FIG. 1, the base is connected to the connecting point of the light receipt element 3, and the load resister 6, and the current corresponding to the light received by the light receipt element 3 is inputted to the base.

The both collectors of the transistors 41 and 42 are connected to the bases of the transistors 43 and 44, respectively. The commonly connected emitters of the transistors 43 and 44 are connected to the constant current power source I4. Further, the both collectors of the transistors 43 and 44 are connected to the transistors 100 and 101, respectively.

The base of the transistor 101 is connected in common with the base of the transistor 102, the collector of which is connected to the base of the the transistor 45.

The collector of the transistor 44 becomes the second input terminal (+) of the voltage detecting circuit 5 shown in FIG. 1 and is connected to the collector of the transistor 101 at the same time. The emitter of the transistor 45 is connected to the base of bypass current control element 2.

Further, in FIG. 2, R1–R10 are resisters. The constant current power source I1 is constituted of the transistor 46 and the resister R10. The base voltage potential of the transistor 47 of the series circuit of the transistors 47 and 48 and resisters R8 and R9 is connected to the common base/collector of the transistor 46.

The base of the transistor 48 is given the reference voltage potential from the reference circuit not shown in the diagram, and the voltage potential of the collectors of the transistor 47 and the transistor 46 is set to the fixed constant voltage potential. Thus, the electric current flowing through the transistor 46 is set to the fixed constant the electric current.

The constant current power sources I2 through I4 have the same structure with the constant current power source I1, and are connected in common with the collector of the transistor 47 which is not shown in the diagram. Further, the constant current power sources 53 and 54 of the voltage detecting circuit 5 in FIG. 1 also have the same structure with the constant current power source I1, and is given the reference voltage potential from said reference circuit.

In the above-described structure, the operation of the current control circuit 4 described in FIG. 1 is performed. That is, the emitter voltage potential of the transistor 45 becomes the fixed voltage potential in the normal condition, and the constant value of each element and the current of the constant current power sources I1 through I4 are set so as to make the bypass control element 2 to the state of OFF, or to make a large part of current flow through the laser diode $LD_m$ connected in parallel.

On the other hand, in the case where the laser diode $LD_m$ has disconnection fault, the collector of the transistor 44 because high potential and accordingly, the base of the transistor 45 has high potential, too, as the collector current Ic of the transistor 51 (referring to FIG. 1) is drawn to the voltage detecting circuit 5.

Then, the transistor 45 becomes conductive, so that the base electric current of the bypass electric control element 2 becomes larger and it becomes possible to supply the electric current to other laser diodes LD connected in series even in the case where the laser diode $LD_m$ causes disconnection fault.

Figure 3:
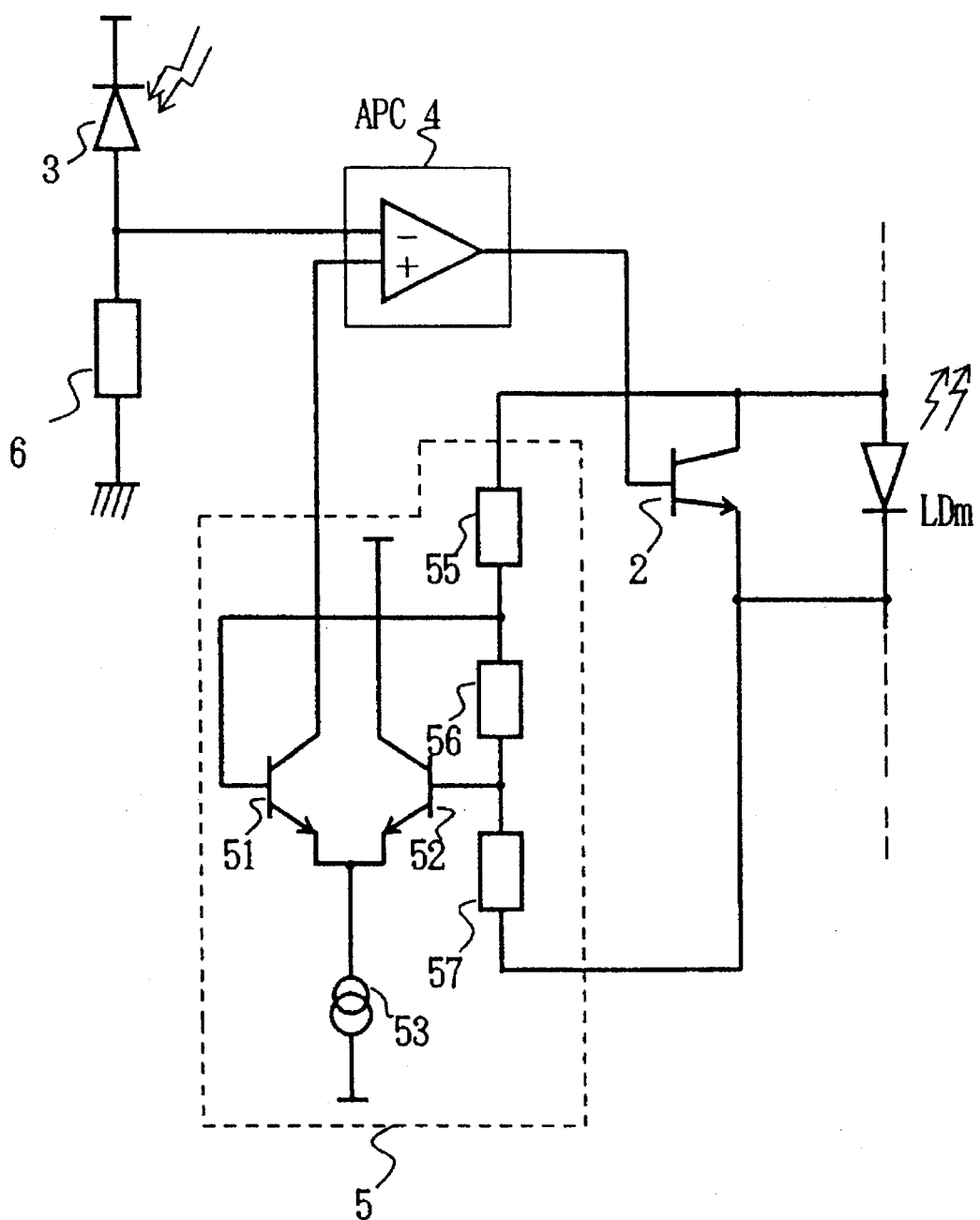
FIG. 3 is a circuit showing a second embodiment of the present invention.

FIG. 3 illustrates a circuit for explaining the second embodiment of the present invention and the structure of the voltage detecting circuit 5 is made simple, compared with the embodiment in FIG. 1. The other structures are same as the circuit of the embodiment in FIG. 1.

That is, the voltage detecting circuit 5 in the embodiment of FIG. 3 is constituted from the series circuit of a pair of the transistors 51 and 52, the resisters 55 through 57 and the constant current power source 53.

The both ends of the series circuit of resisters 55 through 57 are connected to the both terminals of the light emitting element $LD_m$. Further, each base of the transistors 51 and 52 are given voltage potential of both terminals of the resister 56. Furthermore, the collector of the transistor 51 is connected to the second input terminal of the current control circuit 4.

In the case where the light emitting element $LD_m$ is in the condition of normal operation, this structure is same as one described in FIG. 1. Further, the operation in the case where the light emitting element $LD_m$ causes disconnection fault, so that the optical power becomes zero as follows.

The voltage potential between the both terminals is ascended by the disconnection of laser diode $LD_m$, which is the light emitting element. And then, the base voltage potential of the transistor 52 is descended, while the base voltage potential of the transistor 51 is ascended.

Accordingly, the OFF state of the transistor 51 when the light emitting element $LD_m$ is in the condition of normal operation is switched to the ON state and the collector current Ic of the transistor 51 flows to the current control circuit 4. Thus, as described in FIGS. 1 and 2, the bypass current control element 2 becomes conductive, thus keeping the supply of the electric current to other light emitting elements LD.

Figure 4:
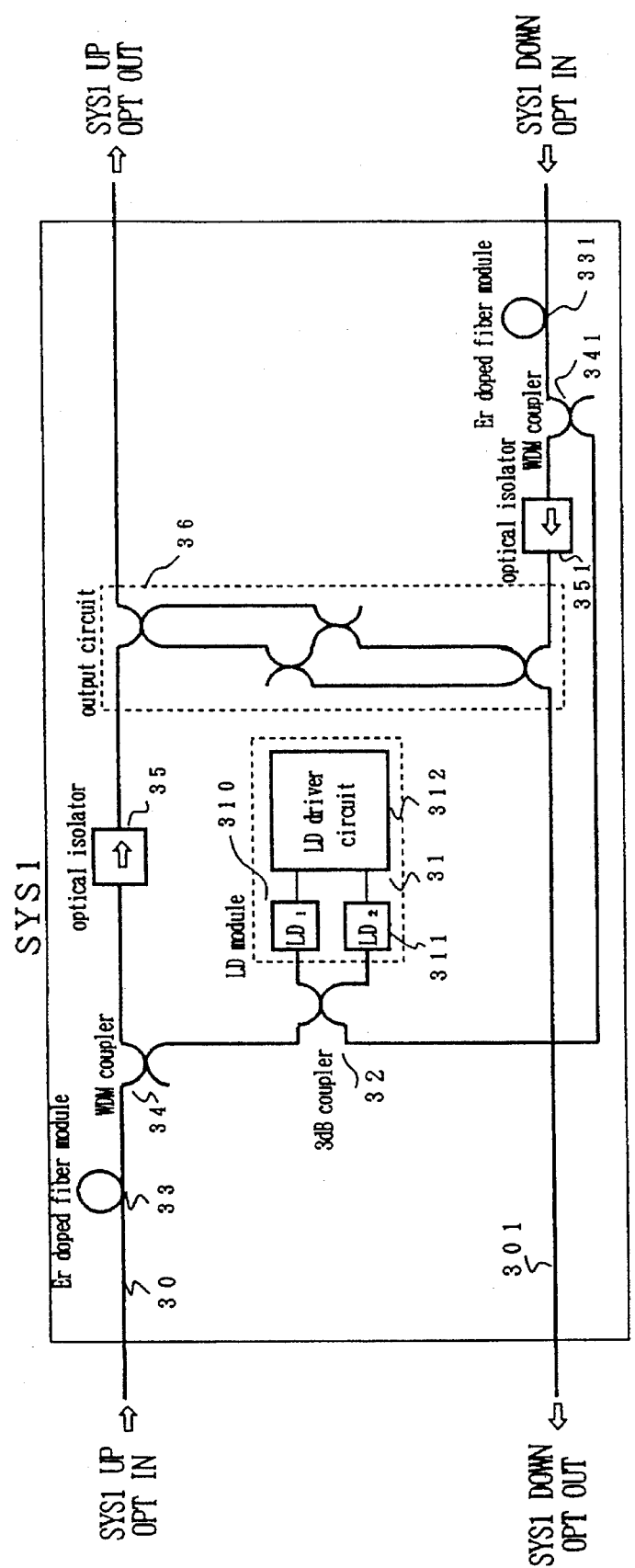
FIG. 4 is a block diagram showing one embodiment in the case where the present invention is applied on the optical amplifying repeater.

FIG. 4 is a block diagram showing one embodiment in the case where the present invention is applied on an optical amplifying repeater. Further, it is a structural block diagram of the optical amplifying repeater according to SYS 1 of duplicate system (SYS 1, SYS 2) for work and protect.

In the diagram, 30 and 301 are optical transmission lives in the ascending channel and descending channel. Each of the optical transmission lives in the ascending circuit 30 and the descending channel 301 is provided with the Er doped fiber modules 33 and 331, WDM couplers 34 and 341 and optical isolators 35 and 351.

Further, an output circuit module 36 is provided between the optical transmission lives 30, 301 in the ascending and the descending channels for performing the loop-back communication.

The Er doped fiber modules 33 and 331 are the optical repeaters constituted by the wound optical fiber of the several meters~several 10 meters, doped with erbium (Er), which is rare earth material.

This optical repeater is used for performing amplification function by using the characteristic that inducted emission is produced and the power of signal light becomes larger gradually along the optical fiber, in the case where the signal light is inputted to the Er atoms in the optical fiber, excited to a higher energy level by the exciting light (for example, the wave length of 1.48 μm).

"31" means the light exciting source using the driving circuit of the light emitting element according to the present invention for supplying the exciting light for the Er doped fiber modules 33 and 331. It has a first laser diode 310, a second laser diode 311 and the driving circuit 312.

The optical power of two laser diodes 310 and 311 is composed by the 3 dB coupler 32, branched, and supplied to the Er doped fiber modules 33 and 331 coupled to the fiber transmission lives 30 and 301 by the WDM couplers 34 and 341 for the ascending and descending channels.

Figure 5:
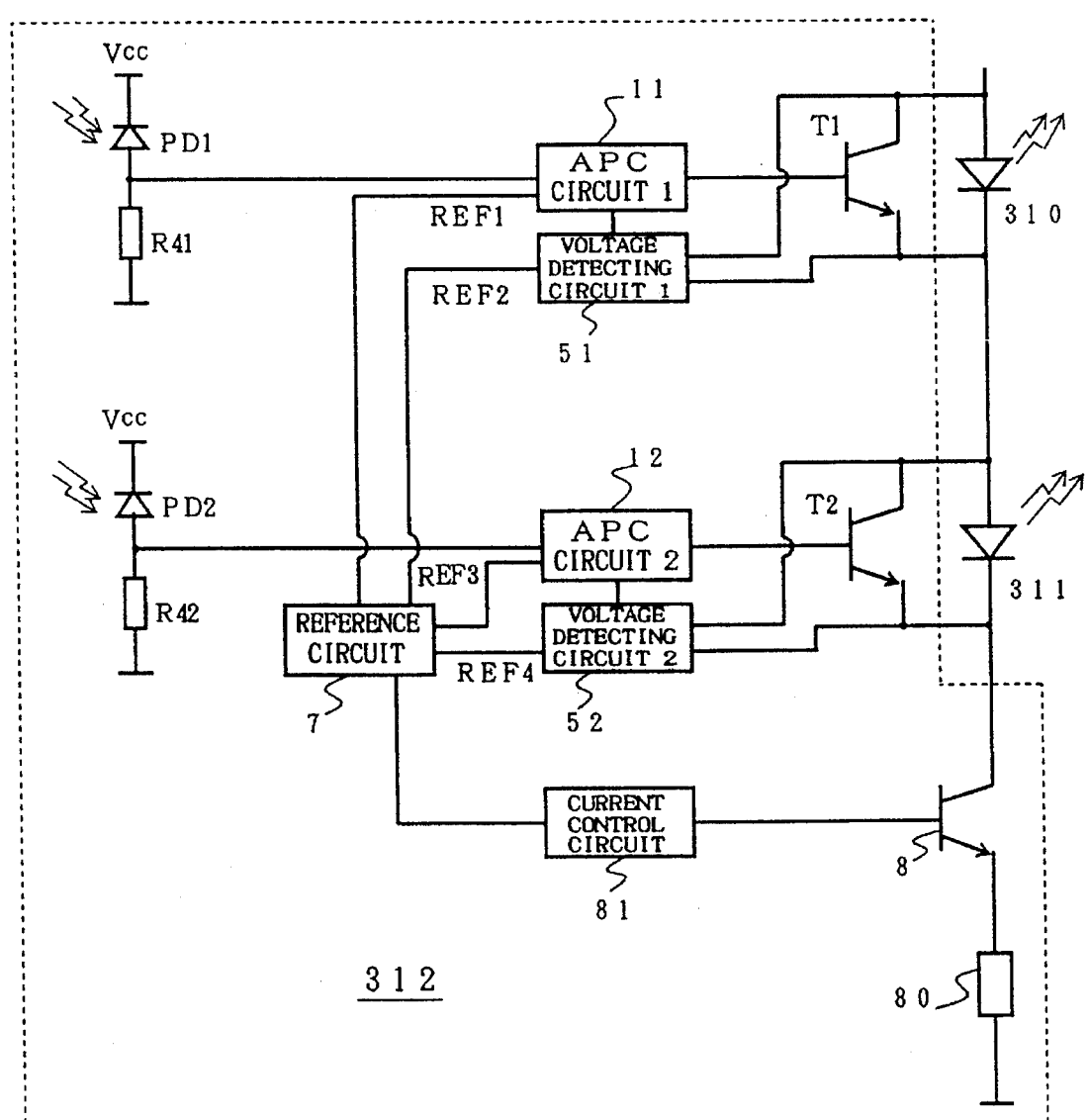
FIG. 5 is a block diagram showing one embodiment of light emitting source for the optical amplifying repeater.
Figure 6:
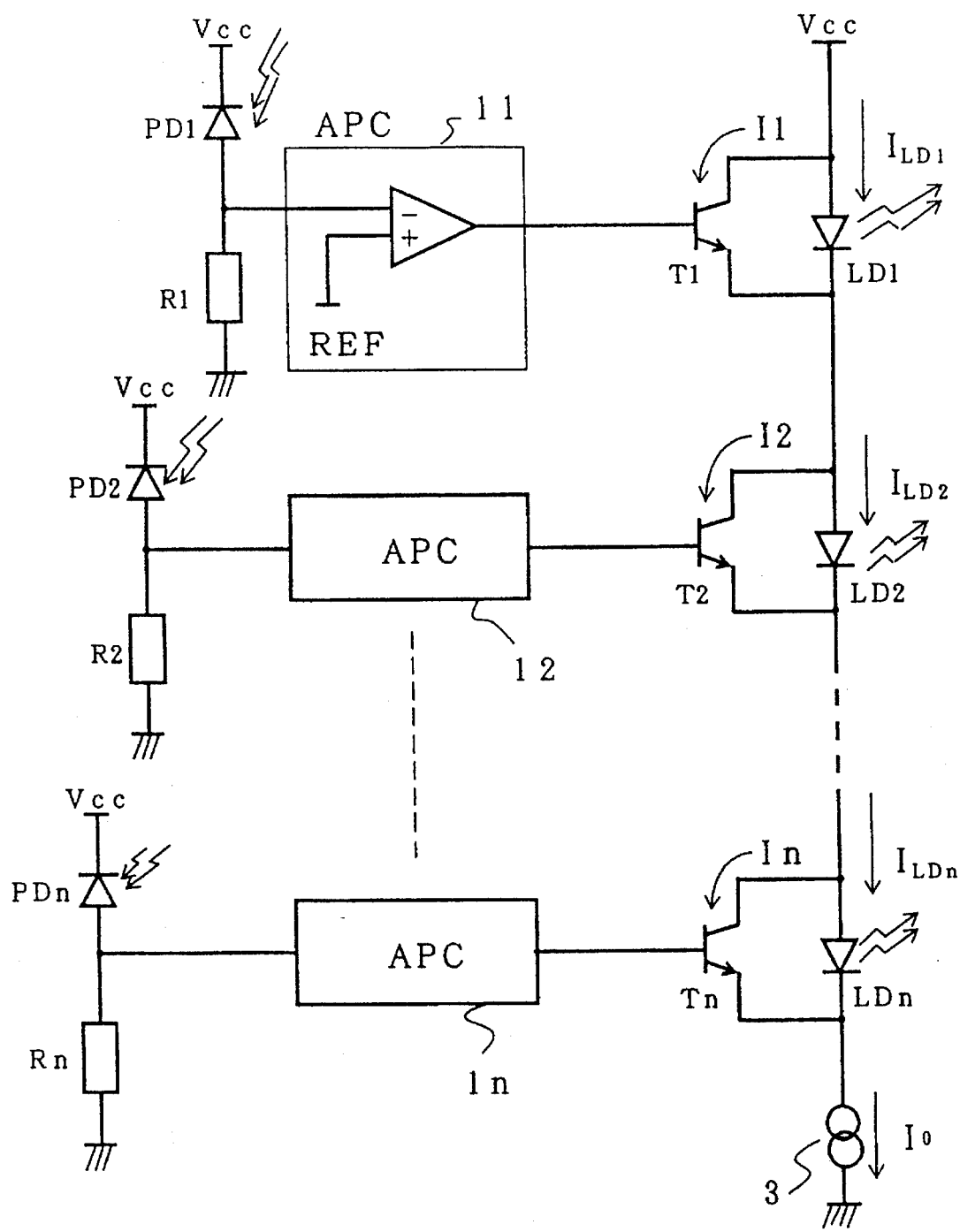
FIG. 6 is an explanatory diagram of the conventional circuit (No. 1).
Figure 7:
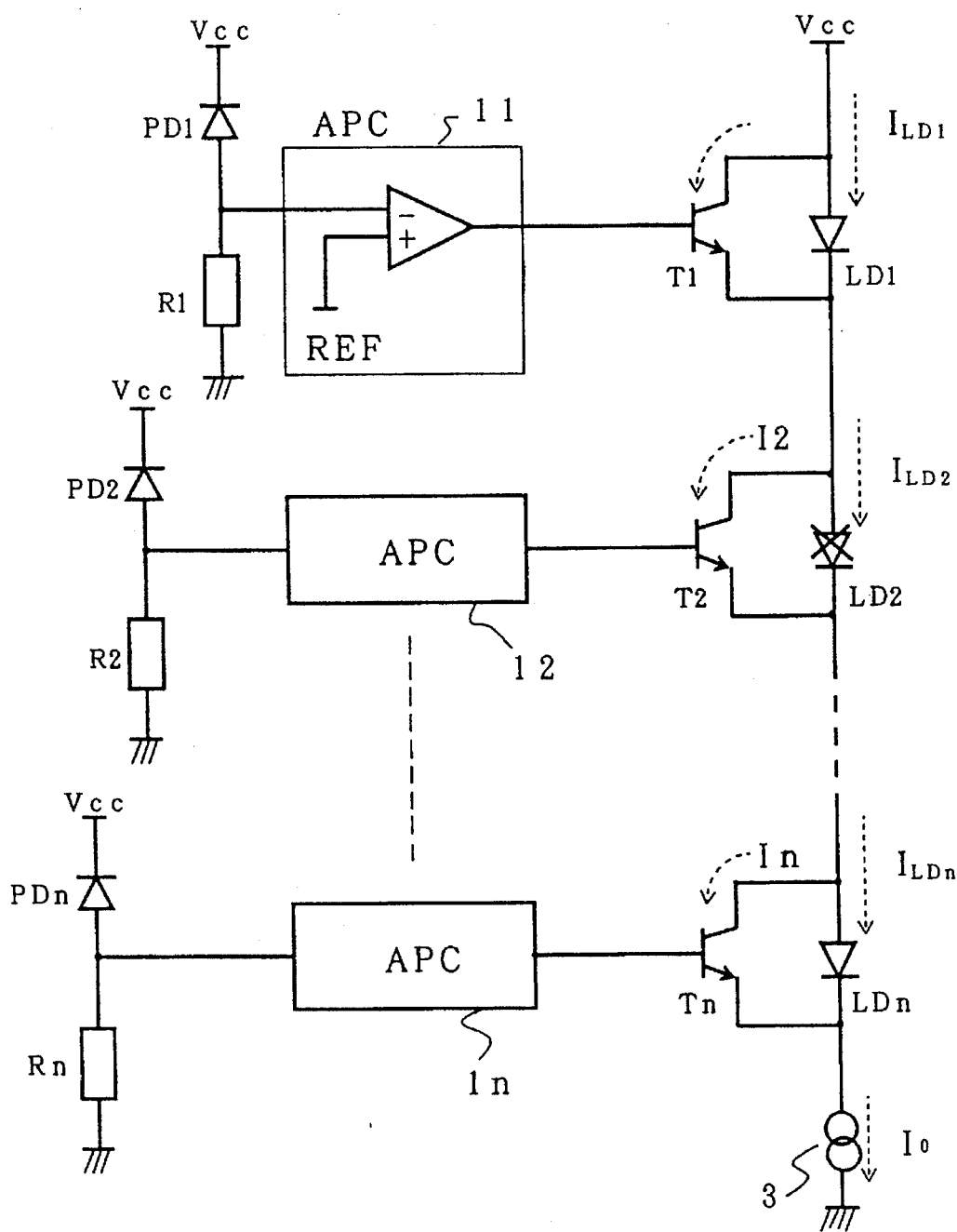
FIG. 7 is an explanatory diagram of the conventional circuit (No. 2).

The light exciting source 31 using the driving circuit for the light emitting element according to the present invention is constituted as shown in FIG. 5 as an embodiment.

In FIG. 5, the light receipt elements PD1 and PD2 are provided corresponding to the two laser diodes 310 and 311. The light receipt current of these light receipt elements PD1 and PD2 is inputted to the current control circuits (APC circuits) 11 and 12, which has the same structure and function as the current control circuit 4 described in FIGS. 1 and 2.

On the other hand, 51 and 52 are the voltage detecting circuits, which have the same structure and function as the voltage detecting circuit 5 described in FIGS. 1 and 3. Then, it is a circuit for performing the control by the current control circuits (APC circuits) 11 and 12 depending on the output, when disconnection (open) of the laser diodes 310 and 311 are detected, so as to increase the base current of the bypass current control elements T1 and T2.

Accordingly, returning to FIG. 4, the light output from the 3 dB coupler 32 decreases by half, but does not become zero, because of the light exciting source 31 in FIG. 5, which includes the driving circuit of the light emitting element according to the present invention, even if it is the case where disconnection fault occurs on either of two laser diodes 310 and 311.

Hereby, it becomes possible to keep the exciting light of the Er doped fiber modules 33 and 331. That is, by applying the present invention, reliability of the system increases as the optical amplifying repeater is kept to work, even if the case where disconnection fault occurs on the laser diodes 310 and 311, according to applying the present invention.

According to the present invention, it becomes possible to keep the vias the electric current to other light emitting elements, even if disconnection fault of one light emitting element occurs in the circuit having multiple light emitting elements connected in series. Accordingly, it becomes possible to keep the optical power emitted from multiple light emitting elements.

More particularly, it become possible to keep a reliability of the system in the case where the driving circuit for the light emitting elements according to the present invention is used as the optical power source on the optical transmission system.

The invention may be embodied in other specific form without departing from the sprit or essential characteristics thereof.

The present embodiment is therefore to be considered in all respects as illustrative and not restrictive, the scope of the invention being indicated by the appended claims rather than by the foregoing description and all changes, which come within the meaning and range of equivalency of the claims therefore intended to be embraced therein.

What is claimed is:

1. A driver circuit for light emitting elements connected in series comprising:

a series circuit of a constant current power source and multiple light emitting elements, which are connected in series; and multiple optical power control circuits for controlling the optical power corresponding to each of the multiple light emitting elements, each of said multiple optical power control circuits having, a bypass current control element, which is connected in parallel to the corresponding light emitting element of said multiple light emitting element, a light receipt element for detecting the optical power of the corresponding light emitting element connected to the bypass current control element, a current control circuit (APC) for controlling the current flowing to the bypass current control element in accordance to the light receipt level of the light emitting element and a voltage detecting circuit for controlling the current control circuit thereby to make the current flowing to said bypass current control element be larger, when the voltage value between both terminals of the corresponding light emitting element is detected and the detected voltage value becomes over the fixed voltage value.

2. The driver circuit for light emitting elements connected in series according to claim 1, wherein said multiple light emitting elements are laser diodes and said receipt elements are photo diodes.

3. The driver circuit for light emitting elements connected in series according to claim 1, wherein said bypass current control element is constituted of a transistor, said corresponding light emitting element is connected between the collector and the emitter of the transistor in parallel, and further, the base current of the transistor is controlled by said current control circuit.

4. The driver circuit for light emitting elements connected in series according to claim 1, wherein said current control circuit includes a differential amplifier having a first input terminal and a second input terminal, of the first input terminal being supplied with a voltage potential corresponding to light receipt power and the second terminal being supplied with the output of said voltage detecting circuit, and the differential amplifier supplies an output corresponding to a difference between the input of said second input terminal and the input of said first input terminal to said bypass current control element.

5. The driver circuit for light emitting elements connected in series according to claim 4, wherein said voltage detecting circuit has a pair of the first and second transistors, the emitters of which are commonly connected to a constant current power source, a reference potential is given on the base of the first transistor and the collector of the first transistor is connected to the second input terminal of the differential amplifier in said current control circuit, and the voltage potential in proportion to the voltage value between the both terminals of said light emitting element in supplied to the base of the second transistor.

6. The driver circuit for light emitting elements connected in series according to claim 4, wherein said voltage detecting circuit has a pair of the first and second transistors, the emitters of which are commonly connected to a constant current power source, the collector of the first transistor is connected to the second input terminal of the differential amplifier of said current control circuit, and the voltage potential in proportion to the voltage value between the terminals of said light emitting element is given between the bases of the first and second transistors.

7. An optical amplifying repeater comprising: optical transmission fibers; Er doped fiber modules, which are positioned on the way of the optical transmission fibers; and an exciting light source for supplying an exciting light to the Er doped fiber modules, said exciting light source having, a series circuit of a constant current power source and multiple light emitting elements, which are connected in series; and multiple optical power control circuits for controlling the optical power corresponding to each of the multiple light emitting elements, each of said multiple optical power control circuits including, a bypass current control element, which is connected in parallel to the corresponding light emitting element of said multiple light emitting element, a light receipt element for detecting the optical power of the corresponding light emitting element connected to the bypass current control element, a current control circuit (APC) for controlling the current flowing to the bypass current control element in accordance to the light receipt level of the light emitting element and a voltage detecting circuit for controlling the current control circuit thereby to make the current flowing to said bypass current control element be larger, when the voltage value between both terminals of the corresponding light emitting element is detected and the detected voltage value becomes over the fixed voltage value, and supplying to said Er doped fiber modules by composing optical power from multiple light emitting elements.

8. The optical amplifying repeater comprising: optical transmission fibers for the ascending and descending channels; first and second Er doped fiber modules, which are positioned on each of the optical transmission fibers for the ascending and descending channels respectively;

an exciting light source for supplying an exciting light to the first and second Er doped fiber modules;

a coupler for branching the exciting light from the exciting light source, and first and second WDM couplers for uniting the exciting light branched from the coupler to the optical transmission fibers on the ascending and descending channels, said exciting light source having, a series circuit of a constant current power source and multiple light emitting elements, which are connected in series; and multiple optical power control circuits for controlling the optical power corresponding to each of the multiple light emitting elements, each of said multiple optical power control circuits including, a bypass current control element, which is connected in parallel to the corresponding light emitting element of said multiple light emitting element, a light receipt element for detecting the optical power of the corresponding light emitting element connected to the bypass current control element, a current control circuit (APC) for controlling the current flowing to the bypass current control element in accordance to the light receipt level of the light emitting element and a voltage detecting circuit for controlling the current control circuit thereby to make the current flowing to said bypass current control element be larger, when the voltage value between both terminals of the corresponding light emitting element is detected and the detected voltage value becomes over the fixed voltage value, and supplying to said Er doped fiber modules by composing optical power from multiple light emitting elements.

* * * * *